United States Patent [19]

Wilke et al.

[11] Patent Number: 4,564,804
[45] Date of Patent: Jan. 14, 1986

[54] METHOD AND APPARATUS FOR AUTOMATICALLY DETECTING SIGNAL LEVELS

[75] Inventors: William G. Wilke, Beaverton; Michael G. Reiney, Tigard, both of Oreg.

[73] Assignee: Tektronix, Inc., Beaverton, Oreg.

[21] Appl. No.: 271,496

[22] Filed: Jun. 8, 1981

[51] Int. Cl.[4] ............... G01R 19/16; G01R 19/00
[52] U.S. Cl. .................. 324/103 P; 307/351; 324/102
[58] Field of Search ......... 324/103 P, 102, 121 R; 340/347 AD; 307/351, 352, 353

[56] References Cited

U.S. PATENT DOCUMENTS 3,781,871 12/1973 Mattern ............... 340/347 AD

Primary Examiner—Ernest F. Karlsen
Attorney, Agent, or Firm—George T. Noe

[57] ABSTRACT

A method and apparatus for automatically detecting peak values of an applied unknown electrical signal employ a binary search technique in which a digital signal is converted to analog reference voltage levels one bit at a time from the most significant bit to the least significant bit to be compared with the unknown signal until finally a digital signal is produced which corresponds to a peak value. By selecting and controlling the comparator slope, both positive and negative peaks may be detected. The search for positive and negative peaks of signals occurring in one or more signal channels may be interleaved to decrease total detection time. From the detected values, a triggering voltage level may be arithmetically computed.

15 Claims, 4 Drawing Figures

METHOD AND APPARATUS FOR AUTOMATICALLY DETECTING SIGNAL LEVELS

BACKGROUND OF THE INVENTION

It is often desirable to determine values of unknown DC voltage levels or time-varying signals without using an oscilloscope or an external voltmeter. It is also often desirable to make use of such values in a number of ways, such as determining a stable triggering point for repetitive signals, or making peak-to-peak voltage measurements, or making risetime and falltime measurements of pulse edges, et cetera. Such situations arise in the use of electronic counter or timer apparatus, wherein applied unknown signals or voltage levels are measured to determine such characteristics as frequency, elapsed time between electrical events, numbers of electrical events occurring, and so forth. Such electronic counter apparatus typically have an input voltage window to limit the positive and negative peak amplitudes to a predetermined dynamic range, and a triggering level within such triggering window through which a signal must pass to generate a count response by the counter circuits. An operator manually adjusts the triggering level by means of a front-panel control to set the triggering level at a point which will result in stable triggering. If the overall signal amplitude is much smaller than the triggering window, some hunting with the front-panel control is necessary to locate the signal, followed by trial-and-error adjustments to stabilize the count.

This problem has been recognized by other investigators in the art, and automatic level-detecting and triggering apparatus and methods have been developed. One such automatic triggering circuit is described in U.S. Pat. No. 4,121,164, which is assigned to the assignee of the present invention. Here, the trigger level voltage is automatically swept through the triggering window until the input signal voltage level is encountered. However, the sweeping of the triggering level continues so that triggering occurs at different arbitrary levels if the input signal is time varying.

U.S. Pat. No. 4,069,452 teaches an apparatus which automatically detects the precise values of upper and lower peaks, as well as the mid-point, of a time-varying signal. A series of stairstep voltage ramps scan predesignated ranges within the triggering window to encounter the input signal. When the general area of positive and negative peaks are determined, a smaller stair voltage ramp is used to precisely (within the step increment) locate the peaks. The midpoint between peaks may then be computed. This is a rather lengthy coarse-fine process, particularly if the input signal is changing very slowly or is a low-frequency repetitive signal. Furthermore, this system does not lend itself to accurate detection of fast electrical spikes occurring at a very low repetition rate, it cannot detect out-of-range signals, nor can it determine DC voltage levels because there is no facility for changing slope to allow sweeping in on the voltage level from both directions. In other words, a voltage level may be detected, but it is unknown whether such level is actually a signal peak or a DC voltage.

SUMMARY OF THE INVENTION

In accordance with the present invention, a binary search technique is utilized automatically and accurately to detect voltage levels of an applied unknown signal or DC voltage within a predetermined dynamic range or triggering window. The unknown signal or DC voltage is applied to one input of a voltage comparator. An n-bit digital signal generated by a logic control unit is converted to an analog reference voltage and applied to the other input of the comparator. The output of the comparator is coupled to an edge-triggered device utilized as a detection register, such as a toggled flip-flop or a counter, the status of which in turn is monitored by the logic control unit. A memory and an arithmetic unit complete the basic detection apparatus. The binary search technique involves a test cycle in which n-bit digital test level numbers are selected by the logic control unit in such a manner that the comparator reference voltage test levels converge within the triggering window to the peak values of signals. Once both the positive and negative peak values are known, a point midway therebetween may be calculated to establish a triggering level for autotriggering. Risetime and falltime measurements of pulse edges may be made by calculating the 10% and 90% points for time measurement therebetween. Each test level may be held for a predetermined time, if necessary, to detect low-frequency or low-duty-cycle signals. A no-signal or out-of-range condition may be detected as well. The search steps of positive and negative peak-locating test cycles may be interleaved so that both cycles are carried out concurrently.

In accordance with a specific implementation of the present invention, both channels of a dual-channel universal counter are tested at the same time, utilizing a microcomputer and its associated memory in conjunction with an input comparator and the initial counter stages in each channel.

It is therefore one object of the present invention to provide a method and apparatus for rapidly detecting signal levels of applied unknown signals using a binary search technique.

It is another object of the present invention to determine the values of unknown DC voltages or time-varying signals without the use of external test equipment.

It is a further object of the present invention to automatically provide stable triggering on a time-varying signal without prior determination of signal timing or amplitude characteristics.

It is an additional object of the present invention to detect two or more peak levels of two or more time-varying signals during a single search sequence.

Other objects and advantages will become apparent to those having ordinary skill in the art upon a reading of the following description when taken in conjunction with the accompanying drawings.

DRAWINGS

DETAILED DESCRIPTION OF THE INVENTION

Figure 1:
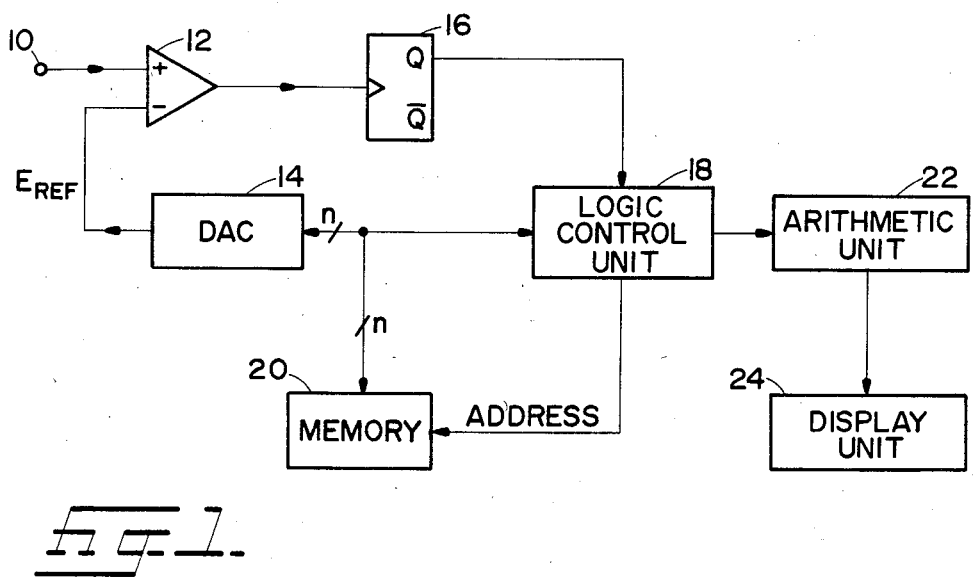
FIG. 1 is a block diagram of an automatic signal level detection apparatus in accordance with the present invention.

Referring now to FIG. 1, there is shown a generalized block diagram of an automatic signal level detection apparatus in accordance with the present invention. An unknown DC voltage or time-varying signal is applied via an input terminal 10 to one input of a comparator 12, where it is compared with a reference voltage applied to the other input thereof from a digital-to-analog converter (DAC) 14. The output of comparator 12 is applied to a transition detection device or detection register, such as an edge-triggered flip-flop 16. A logic control unit 18 generates n-bit digital signals as it sequences through a binary search cycle, changing one bit at a time from the most significant bit (MSB) to the least significant bit (LSB) until finally an n-bit digital number is reached, the equivalent analog voltage of which produced by DAC 14 matches either a DC voltage or a predetermined peak of a time-varying signal applied to input terminal 10. A memory 20 is provided for storing one or more n-bit digital numbers, including the one equivalent to the detected input value. An arithmetic unit 22 is coupled to the logic control unit 18 to provide mathematical functions, such as, for example, calculating risetime or falltime of pulse edges. The detected signal levels or mathematical results may be displayed by display unit 24.

Figure 2:
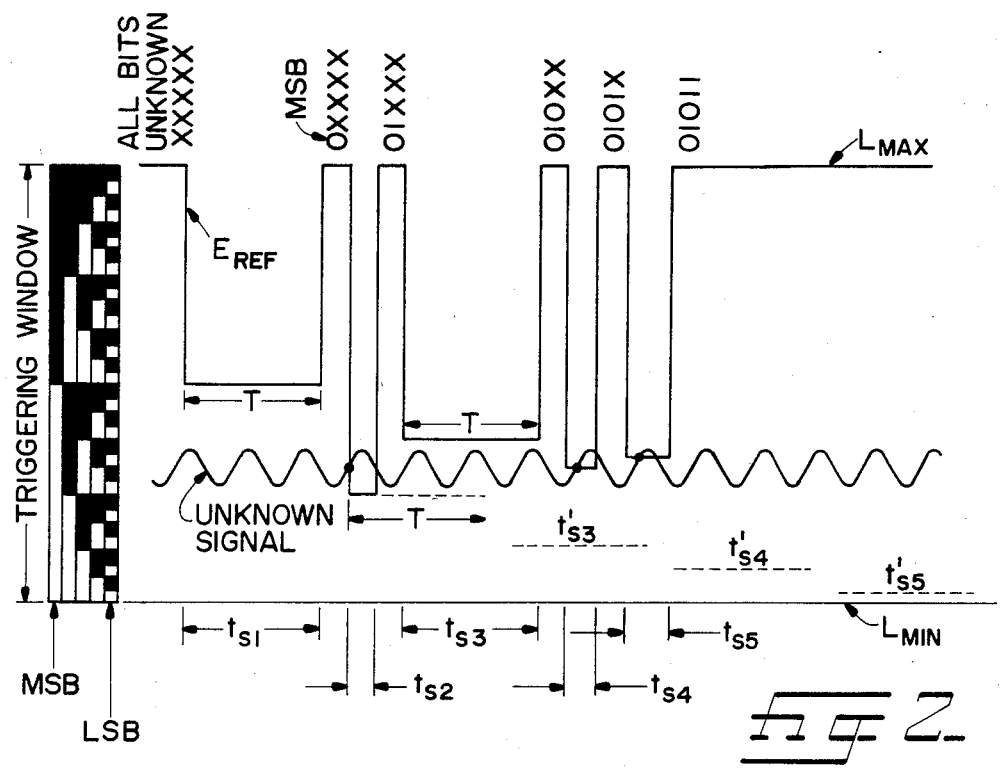
FIG. 2 is a waveform diagram illustrating the binary search technique as employed in locating the positive peak of an applied unknown time-varying signal.

The binary search technique which forms one aspect of the inventive matter employed by the apparatus of FIG. 1 may best be understood in terms of the example shown in FIG. 2. Referring to FIG. 2, there is shown a triggering window having a lower voltage limit $L_{min}$ and an upper voltage limit $L_{max}$. The triggering window is the dynamic range over which input signals may be detected, and is determined by the output of DAC 14, which produces the reference voltage $E_{REF}$ for comparator 12. For this example, it is desired to determine the positive peak of some unknown signal, which is arbitrarily depicted as a low-level repetitive signal occurring generally in the lower half of the triggering window. Also for this example, logic control unit 18 is capable of producing 5-bit digital numbers ranging from 00000 at $L_{min}$ to 11111 at $L_{max}$, the specific 5-bit digital numbers being depicted by the logic diagram on the left-hand side of FIG. 2 wherein the black represents logical ones and the white represents logical zeroes.

At the beginning of a binary search cycle, nothing is known about the input signal, or even whether there is one, and so the logic control unit sets the 5-bit digital number to all ones in the example shown, establishing the reference voltage $E_{REF}$ at $L_{max}$ as shown. The first step is to determine the most significant bit of the 5-bit digital number which is equivalent to the positive peak of the input signal, and this is achieved by applying 01111 (or 10000) to DAC 14, setting $E_{REF}$ exactly halfway between $L_{max}$ and $L_{min}$ to initiate the first test step $t_{s1}$. After setting the first reference level, the logic control unit 18 checks the status of flip-flop 16 to determine whether at least one transition has occurred, indicating that a signal has been detected, since the passing of $E_{REF}$ through the signal voltage will generate a positive-going trigger edge to toggle the flip-flop. In the example shown, no signal is detected; however $E_{REF}$ remains at the level set by the digital number 01111 for up to a time T in accordance with a timing circuit or clock internal to the logic control unit 18. The time T may be predetermined, and may be for example the time period for one cycle of input signal at a designated low-frequency cut-off point. That is to say, the positive peak should pass through the reference level $E_{REF}$ within the time period T if it is going to at all. At the end of the time period T, the first test step $t_{s1}$ is completed and $E_{REF}$ is set back to $L_{max}$ by changing the 5-bit digital number from 01111 to 11111. If the status of flip-flop 16 is unchanged at the end of $t_{s1}$, it is known that nothing is in the upper half of the triggering window. Therefore, the MSB of any value to be detected must necessarily be a logical zero. So 0 is placed in the memory as the most significant bit, with the remaining four bits yet to be determined.

The next test step, $t_{s2}$, is initiated to determine the second most significant bit by setting the 5-bit digital number to 00111, after which logic control unit 18 checks the status of flip-flop 16. Since in the FIG. 2 example $E_{REF}$ passed through the signal in reaching the test level, comparator 12 produced a transition which toggled flip-flop 16. Thus it is known that a signal or DC voltage lies somewhere between the one-quarter and one-half points between $L_{min}$ and $L_{max}$, and there is no need to leave the test level at 00111 for the entire time period T. So test step $t_{s2}$ is terminated, resetting $E_{REF}$ to $L_{max}$, and the detected logical one is stored as the second most significant bit.

In a like manner, the remaining three bits are determined as a 0, a 1, and a 1 by test steps $t_{s3}$, $t_{s4}$, and $t_{s5}$, respectively. The final detected signal, 01011, may be ascertained by inspection in FIG. 2 by comparing the positive peak with the logic diagram at the left-hand side of the illustration.

It can be discerned that if no signal is present within the triggering window, a binary search will be carried out wherein the n-bit digital number applied to DAC 14 will be changed one bit at a time in reverse order from the MSB to the LSB so that the reference voltage $E_{REF}$ applied to comparator 12 will sweep through the triggering window, starting at $L_{max}$ and converging toward $L_{min}$ as shown by the dashed lines indicated as $t'_{s3}$, $t'_{s4}$, and $T'_{s5}$. Thus may a no-signal condition and a range limit condition be detected and indicated. It may also be seen that if the unknown signal is much smaller than shown in the FIG. 2 example, or indeed only a DC level, the precise level would still be properly determined. This is because the apparatus in accordance with the present invention needs only a single transition to be observed in flip-flop 16, and further because the slope has been correctly chosen so that a countable transition occurs when $E_{REF}$ crosses the unknown signal going in a negative direction (or when the unknown signal crosses $E_{REF}$ going in a positive direction).

While FIG. 2 shows the binary search technique for detecting positive peaks of a signal, it should be understood the search for negative peaks is carried out in a similar manner with an opposite slope setting, beginning at $L_{min}$ and sweeping upwardly into the triggering window. To observe proper polarity in operating the edge-triggered flip-flop 16, a slope control must be provided to ensure that a positive-going reference voltage $E_{REF}$ in seeking the negative peak will produce the same polarity trigger as did a negative-going $E_{REF}$ in seeking the positive peak. Such slope controls are well known in the art, and may be effected by either switching the + and − inputs of comparator 12 or by inverting the comparator output during negative peak search. However, it should be pointed out that inclusion of such slope control in combination with positive and negative peak detection is an important aspect of the present invention.

As mentioned previously, the detected values for both the positive and negative peaks of a signal are stored in memory 20. These values may be transferred to arithmetic unit 22 by the logic control unit 18, wherein, for example, the 50% point between peaks may be calculated to generate a triggering level to provide stable triggering of an input signal. If the comparator 12 and transition detection device 16 form part of the input stage of a digital counter, it is a significant attribute of the present invention that the components used in detecting signal levels are the same ones used for the actual signal processing. Such a dual role eliminates such design problems as component matching or drift compensation. Also, cost factors and power consumption of the host instrument are reduced. The arithmetic unit 22 may also calculate the traditional 10% and 90% points between signal peaks to facilitate risetime and falltime measurements of pulse transitions. The arithmetic unit may be useful in verifying the recognition of DC voltage levels, since in such a case the detected positive and negative peaks would be equal to each other.

Figure 3:
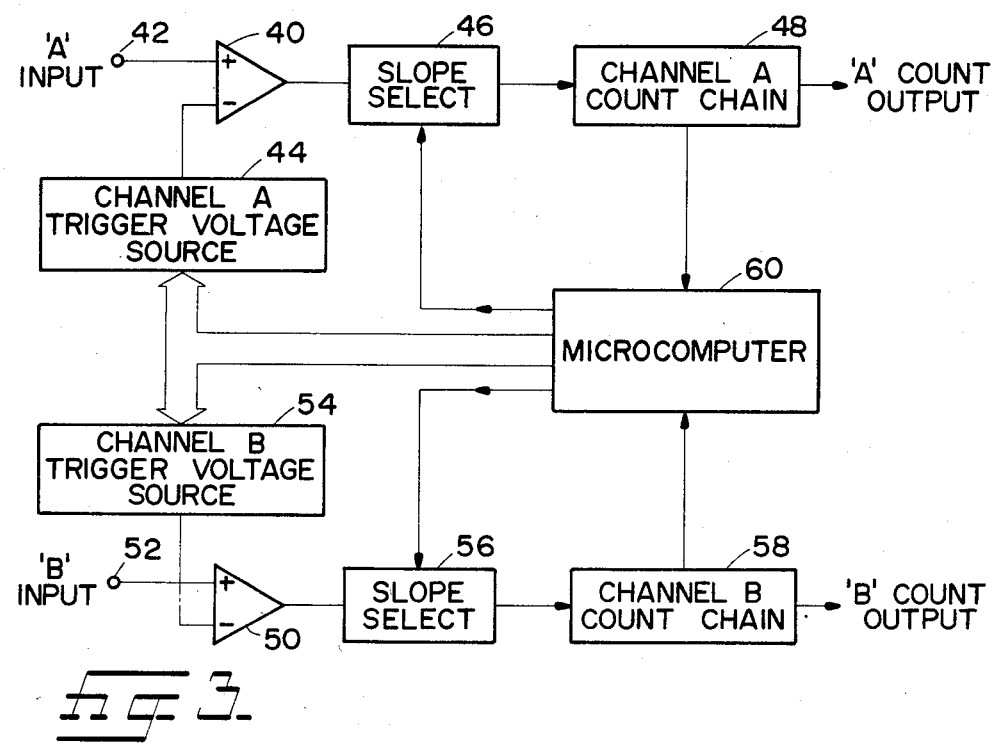
FIG. 3 is a block diagram of a dual-channel counter input stage employing the automatic signal-detecting apparatus in accordance with the present invention.

FIG. 3 shows in block diagram form a dual-channel universal counter input stage employing the automatic signal-detecting apparatus of the present invention. Channel A comprises a comparator 40, the inputs of which are connected to an input terminal 42 and a trigger voltage source 44, respectively, a slope selection circuit 46 for selectively inverting the output of comparator 40, and a conventional edge-triggered count chain 48. Similarly, Channel B comprises a comparator 50, the inputs of which are connected to an input terminal 52 and a trigger voltage source 54, respectively, a slope selection circuit 56 for selectively inverting the output of comparator 50, and a conventional edge-triggered count chain 58. The trigger voltage sources 44 and 54 may suitably be conventional digital-to-analog converters operated as programmable voltage sources. A microcomputer 60, which may suitably be a conventional off-the-shelf microcomputer including a processor and a memory, controls the binary search for both positive and negative peaks of input signals for both channels A and B. The operation of channels A and B is substantially identical, with the microcomputer 60 selecting the polarity (slope) of the comparator output to establish the proper triggering edge for the count chains, setting the comparator reference voltages, and monitoring the counters in the count chains to determine if a change in count has occurred. The state of each count may be determined by either resetting them for each test step of the binary search cycle, or alternatively by keeping track of the count chain contents by reading and storing updated values.

Figure 4:
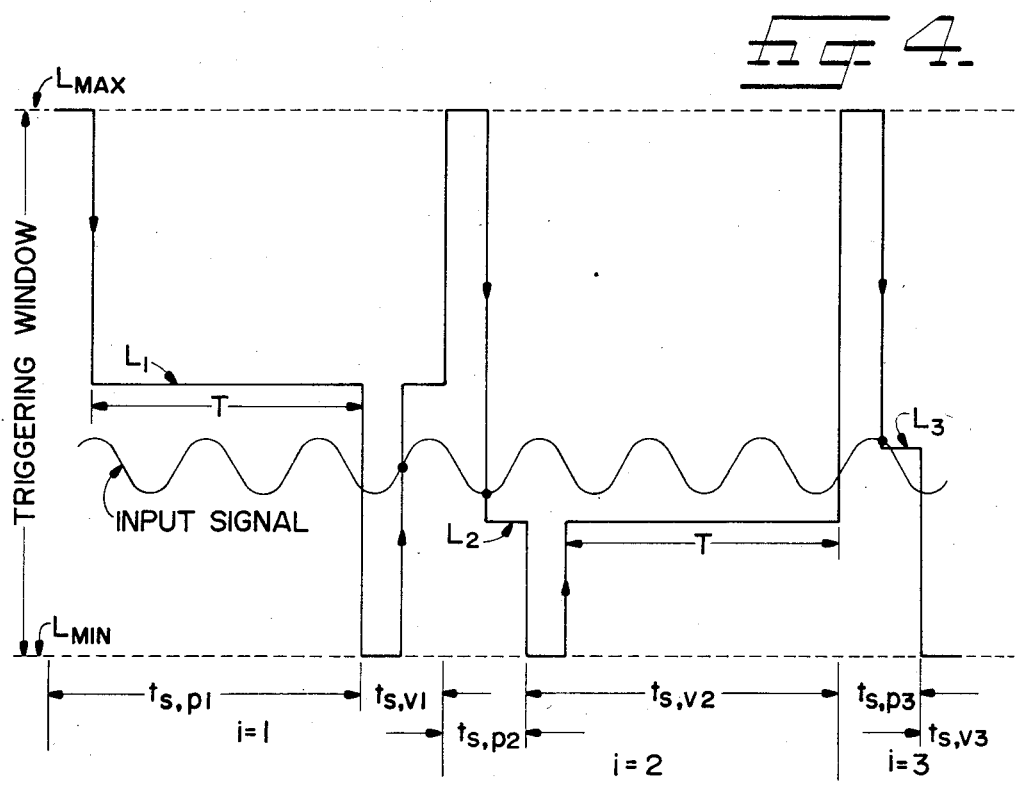
FIG. 4 is a waveform diagram illustrating an interleaved binary search for both positive and negative peaks of an applied unknown time-varying signal.

FIG. 4 is a waveform diagram of an interleaved binary search for both positive and negative peaks, hereinafter referred to as peaks and valleys for convenience, of an applied unknown time-varying signal. The binary search cycle will be described in terms of i steps, wherein $1 \leq i \leq n$ and $i=1$ for the MSB, and $i=2$ for the next MSB, and so on down to $i=n$ for the LSB of an n-bit digital number applied from the microcomputer 60 to the trigger voltage sources 44 and 54. Each test step i is divided into a peak search $t_{s,pi}$ and a valley search $t_{s,vi}$. The search cycle is initiated for each channel by setting the outputs of trigger voltage sources 44 and 54 to $L_{max}$ and setting the slope select circuits 46 and 56 so that a positive-edge pulse will be produced if the input signal exceeds the trigger reference voltage. Then the trigger reference voltages, which will be subsequently controlled independently, are set to $L_1=(L_{max}+L_{min})/2$. The microcomputer 60 reads the contents of the count chains 48 and 58, and the test step $t_{s,p1}$ is terminated either after a count has occurred, indicating the presence of a signal, or after a time period T, indicating the absence of a signal in the upper half of the trigger window. Thereafter, the triggering level is set to $L_{min}$ and the slope set to negative to begin the valley search step $t_{s,v1}$. For $i=1$, the triggering level will be set to $(L_{max}+L_{min})/2$ to determine whether a signal is present at all within the triggering window, since it has already been determined that if there is one, it is in the lower half of the triggering window. Here, the signal is detected between $L_{min}$ and $L_1$, and consequently, the MSB is determined for both a signal peak $V_{max}$ and a signal valley (or negative peak) $V_{min}$. The process repeats for $i=2$ in determining the next most significant bit of both the peak and valley values, until finally the values for $i=n$ are determined.

Since a valley always occurs between successive peaks, efficient use of computer time may be made by interleaving the binary searches for peak and valley values for both channels A and B. This is particularly true for low-frequency input signals where a wait time may be involved after setting a new triggering level. During the wait time, for example, the period T mentioned above, the computer 60 can go off and perform other functions. This may include setting a trigger reference level in another channel, reading any of the count chains, and so forth. For example, the first test step $t_{s,p1}$ may be conducted for channels A and B simultaneously since the count chains 48 and 58 may both be enabled at the same time, or one after the other, making the change of triggering level voltage to $L_{min}$ upon completion of the $t_{s,p1}$ step. It should be pointed out that the binary search for peaks and valleys will be carried out in exactly the same number of steps for both channels A and B, since as mentioned earlier, what is really being determined by the binary search process is the values of binary bits of n-bit digital numbers corresponding to Channel A signal peak ($VA_{max}$) and valley ($VA_{min}$) and Channel B signal peak ($VB_{max}$) and valley ($VB_{min}$). From these values, a 50% triggering point may be calculated, or 10% and 90% points of rising or falling edges may be calculated to facilitate risetime or falltime measurements.

Detection of DC voltages or time-varying signals having a frequency lower than the low-frequency cut-off point is ensured by alternately setting the triggering level to $L_{max}$ and $L_{min}$ on each test step of the binary search cycle so that the entire triggering window is scanned.

An automatic triggering level may be established for time-varying signals having frequencies which are lower than the low-frequency cut-off point of the instrument in which the automatic signal-level-detecting apparatus is embodied; however, such triggering level may or may not be calculated to be at the 50% point between signal peaks. If the slowly-varying signal is within the trigger window, the comparator will generate transitions which will trip the counters during the searches for peaks and valleys, even though the trigger reference voltage does not match the peak values. However, a level detected while searching for a positive peak is necessarily more positive than a valley. And likewise, a level detected while searching for a valley is necessarily more negative than a peak. Accordingly, these two detected levels may be used in establishing an automatic triggering level at some point therebetween.

It will, therefore, be appreciated that the aforementioned and other desirable objects have been achieved; however, it should be noted that the particular embodiments of the invention which are shown and described herein are intended as merely illustrative and not as restrictive of the invention.

What we claim as our invention is:

1. A method for automatically detecting peak values of an applied unknown electrical signal, comprising:
   generating multiple-bit digital signals;
   converting said digital signals to analog values thereby to generate a plurality of reference voltage levels;
   comparing said reference voltage levels with said unknown applied signals and generating detection signals in response to matches of instantaneous values of said unknown applied signals and said reference voltage levels, wherein said reference voltage levels are held for a predetermined time interval if no said matches occur;
   storing said detection signals in storage register means; and
   changing said digital signals one bit at a time in order from most significant bit to least bit responsive to the contents of said storage register means thereby to produce a digital signal which corresponds to the detected peak value of said unknown electrical signal.

2. A method in accordance with claim 1 wherein said digital signal generating step further comprises setting all of the bits to the same logic state prior to changing each bit so that said reference voltage levels are reset to one edge of a triggering window prior to setting each comparison level.

3. A method in accordance with claim 2 wherein said detection signals are generated in response to one predetermined polarity relationship of said reference voltage levels and said unknown signal.

4. A method in accordance with claim 2 wherein steps for detection of positive and negative peaks are interleaved by first setting said reference voltage level to one edge of said triggering window and then to a test level determined by the digital bit changed, then setting said reference voltage level to the other edge of the triggering window and then to a test level determined by the digital bit changed, wherein the polarity relationship of said comparison step is alternately switched to provide detection signals corresponding to correct slope of peak detection.

5. An apparatus for automatically detecting peak values of at least one applied unknown electrical signal, comprising:
   means for generating multiple-bit digital signals;
   means for converting said digital signals to analog values thereby to generate a plurality of reference voltage levels;
   means for comparing said reference voltage levels with said unknown applied signals and generating detection signals in response to matches of instantaneous values of said unknown applied signals and said reference voltage levels, wherein said reference voltage levels are held for a predetermined time interval if no said matches occur; and
   detection register means coupled to said comparing means for storing said detection signal;
   wherein said means for generating digital signals comprises logic control means coupled to said detection register means and said digital-to-analog converting means for changing said digital signals one bit at a time in order from most significant bit to least significant bit in response to the contents of said detection register means thereby to produce a digital signal which corresponds to the detected peak value of said applied unknown electrical signal.

6. An apparatus in accordance with claim 5 further including slope selecting means associated with said comparing means so that said detection signals are produced in response to predetermined polarity relationships between said reference voltage levels and said unknown signal.

7. An apparatus in accordance with claim 5 further including memory means associated with logic control means for storing one or more of said digital signals.

8. An apparatus in accordance with claim 7 wherein the combination of said logic control means and said memory means comprises a microcomputer.

9. An apparatus in accordance with claim 7 further comprising arithmetic means associated with said logic control means for performing arithmetic operations on digital signals corresponding to said detected peak values.

10. An apparatus in accordance with claim 5 wherein said reference voltage generating means comprises a digital-to-analog converter which is responsive to said digital signals, and said comparing means comprises a comparator.

11. An apparatus in accordance with claim 5 wherein said detection register means comprises at least a portion of a count chain of a counter.

12. An apparatus in accordance with claim 5 wherein said comparing means comprises a plurality of comparators, each of which receives a respective one of a plurality of applied unknown electrical signals, said detection register means comprises a plurality of detection registers, each of which is coupled to the output of a respective comparator, and said logic control means includes means for interleaving reading the contents of said detection registers and generating new digital signals for said comparators so as to concurrently carry out detection of peak values of said plurality of applied unknown signals.

13. Apparatus in accordance with claim 12 further including means for independently selecting the slope of said plurality of applied unknown electrical signals at which detection signals may be generated.

14. In a multiple channel signal processing device, an apparatus for automatically detecting peak values of two or more applied unknown signals, comprising:
   means for generating a plurality of reference voltage levels;
   means for comparing said reference voltage levels with said unknown signals and generating detection signals in response thereto;
   detection register means associated with each channel and coupled to said comparing means for storing said detection signals; and
   logic control means coupled to said detection register means and said reference voltage generating means for generating and storing digital signals corresponding to said reference voltage levels in response to changed status of the contents of said detection registers, wherein said logic control means interleaves the reading of said detection registers of said multiple channels and causing new reference voltage levels to be generated so as to concurrently carry out detection of peak signal values in said multiple channels.

15. An apparatus in accordance with claim 14 further including means for independently selecting the slope of said unknown signals at which detection signals may be generated.

* * * * *